United States Patent

Bakowski et al.

Patent Number: 6,040,237
Date of Patent: Mar. 21, 2000

[54] FABRICATION OF A SIC SEMICONDUCTOR DEVICE COMPRISING A PN JUNCTION WITH A VOLTAGE ABSORBING EDGE

[75] Inventors: Mietek Bakowski, Skultuna; Ulf Gustafsson, Linkoping; Kurt Rottner, Kista; Susan Savage, Jarfalla, all of Sweden

[73] Assignee: ABB Research Ltd., Zurich, Switzerland

[21] Appl. No.: 08/956,959

[22] Filed: Oct. 23, 1997

Related U.S. Application Data

[62] Division of application No. 08/683,059, Jul. 16, 1996.
[51] Int. Cl.⁷ .................................... H01L 21/26
[52] U.S. Cl. ..................... 438/521; 438/518; 438/931
[58] Field of Search .................... 438/518, 521, 438/527, 529, 549, 931

[56] References Cited

U.S. PATENT DOCUMENTS

| | | | |
|---|---|---|---|
| 4,573,066 | 2/1986 | Whight | 257/495 |
| 4,648,174 | 3/1987 | Temple et al. | |
| 4,927,772 | 5/1990 | Arthur et al. | 437/6 |
| 4,947,218 | 8/1990 | Edmond et al. | |

FOREIGN PATENT DOCUMENTS 06268202 of 1994 Japan.

WO 95/32524 of 1995 WIPO.

OTHER PUBLICATIONS

Neudeck et al., 2000 V 6H–SiC P–N Junction Diodes Grown by Chemical Vapor Deposition, Appl. Phys. Lett. 64 (11), Mar. 14, 1994, pp. 1386–1388.

Bhatnagar et al., Comparison of 6H-SiC, 3C-SiC, and Si for Power Devices, IEEE Transactions on Electron Devices, vol. 40, No. 3, Mar. 1993, pp. 645–655.

R. Stengl et al., Variation of Lateral Doping—A New Concept to Avoid High Voltage Breakdown of Planar Junctions, IEDM, Dec. 1985, pp. 154–157.

*Primary Examiner*—Charles Bowers
*Assistant Examiner*—Keith Christianson
*Attorney, Agent, or Firm*—Pollock, Vande Sande & Amernick

[57] ABSTRACT

A semiconductor component and a method for processing said component, which comprises a pn junction, where both the p-conducting (3) and the n-conducting layers (2) of the pn junction constitute doped silicon carbide layers and where the edge of the higher doped conducting layer of the pn junction exhibits a charge profile with a stepwise or uniformly decreasing total charge or effective surface charge density from the initial value at the main pn junction to a zero or almost zero total charge or charge density at the outermost edge of the junction following a radial direction from the central part of the junction towards the outermost edge.

9 Claims, 2 Drawing Sheets

FABRICATION OF A SIC SEMICONDUCTOR DEVICE COMPRISING A PN JUNCTION WITH A VOLTAGE ABSORBING EDGE

This application is a divisional of U.S. patent application Ser. No. 08/683,059, filed Jul. 16, 1996.

FIELD OF THE INVENTION

The present invention relates to a semiconductor component with silicon carbide as the base material, where the component comprises at least one pn junction and where a risk of voltage breakdown due to a strong electric field at the edge of the junction is reduced as the pn junction contains an edge termination with a decreasing charge content in the direction away from the symmetry axis of the component and situated preferably on a highly doped side of the pn junction.

BACKGROUND OF THE INVENTION

Semiconductor components based on silicon carbide as the base material are continuously developed to be used in connection with high temperatures, high power applications and under high radiation conditions. Under such circumstances conventional semiconductors do not work satisfactorily. Evaluations indicate that power MOSFET-type SiC semiconductor and SiC based diode rectifiers would be able to operate over a greater voltage and temperature interval, for example up to 650–800° C., and show better switching properties, such as lower losses and higher working frequencies, and nevertheless have a volume 20 times smaller than corresponding silicon components. These possible improvements are based on the favorable material properties that silicon carbide possesses in relation to silicon. The favorable properties include, for example, a higher breakdown field (up to 10 times higher than silicon), a higher thermal conductivity (more than 3 times higher than silicon) and a higher energy band gap (2.9 eV for 6H-SiC, one of the crystal structures of siC).

As SiC semiconductor technology is relatively young and in many aspects immature, there are many critical manufacturing problems to be solved before SiC semiconductor devices may be experimentally realized and manufacted in high volume. This is especially true of components intended for use in high-power and high-voltage applications.

One difficulty to overcome when manufacturing high voltage diodes or other types of semiconductor components comprising a voltage absorbing pn junction is to produce a proper junction termination at the edge of the junction. The electric field at the periphery of the junction is normally enhanced compared to the electric field in the bulk of the junction. This field increase at the periphery of the junction may be further reinforced in the presence of surface charge.

A high electric field at the edge of the pn junction implies a great risk of voltage breakdown or flash-over at the edge of the junction as well as gives rise to an instability of the blocking voltage, known as voltage drift.

To avoid the above-discussed disadvantages it becomes very important to reduce the field concentration, where the junction reaches the surface. Combined with efforts to passivate the surface of the component, measures are taken to flatten out the electric field at the surface, for example by acting on how the pn junction emerges at the surface. As an example it is known from silicon power components to lap (grind, sandblast, etch) the surface of the edge to a certain angle in relation to the pn junction to thereby flatten out the field. Another known technique is to gradually decrease the charge content on the highly doped side of the junction, such that the charge content of the highly doped layer is reduced towards the outermost edge of the junction. (This technique is known as Junction Termination Extension or JTE). The methods, known from silicon technology, used to achieve a JTE of an Si component are difficult or almost impossible to apply to components based on silicon carbide due to the great hardness of the material and extremely low diffusivity of proper SiC dopants. As an example, doping through diffusion is not feasible for SiC, as diffusion coefficients are negligible below 2270° K. Also, ion implantation of doping elements, a common technique when manufacturing Si components, is difficult to master and not yet fully developed for SiC. Hence, many of the problems reminiscent of those prevalent at the beginning of the development of corresponding silicon components to be solved when developing semiconductor components from SiC have not been solved as yet for pn junctions in SiC.

High voltage diodes from 6H-SiC with epitaxially formed pn and Schottky junctions have been made experimentally (see e.g. M. Bhatnagar and B. J. Baliga, IEEE Trans. Electron Devices, vol. 40, no. 3 pp 645–655, March 1993 or P. G. Neudeck, D. J. Larkin, J. A. Powell, L. G. Matus and C. S. Salupo, Appl. Phys. Lett. vol 64, No 11, Mar. 14, 1994, pp 1386–1388). Some of the problems related to SiC devices have thus been solved, but no reliable solution to the problems connected with electric field concentration at the edges of the junction has been presented as yet.

The electric field may be reduced at the edge of the pn junction by applying a semi-isolating layer to the edge of the junction of an SiC component. Such a solution is described in patent document PCT/SE94/00482.

Any method or device to produce a semiconductor component corresponding to the principle of Junction Termination Extension at a pn junction composed of Si is not publicly known for a component, where SiC constitutes the base material of the junction. Solutions for producing SiC components comprising pn junctions with JTEs are described in the unpublished patent application Ser. No. 08/520,689, which is hereby included in this description by reference. The solutions described there involve a stepwise decrease of charges of the JTE towards the edge of the JTE utilizing an etch down technique, epitaxial regrowth or ion implantation to control the surface doping and surface fields. The present invention aims at describing a voltage absorbing edge at a pn junction with a JTE structure of an SiC component where the pn junction has a planar structure.

The term SiC is used in the following text to refer to any of the principal crystal polytypes of this material known as 6H, 4H, 2H, 3C and 15R.

SUMMARY OF THE INVENTION

One aspect of the invention includes a planar structure semiconductor component. The component includes a pn junction, where both a p-conducting layer and an n-conducting layer of the pn junction constitute doped silicon carbide layers. The edge of the higher doped conducting layer of the pn junction exhibits a charge profile with a stepwise or uniformly decreasing total charge and/or effective sheet charge density from an initial value at the periphery of a main junction area to a zero or almost zero total charge at the outermost edge of a junction extension following a radial direction from the central part of the main junction towards the outermost edge.

Other aspects of the invention includes methods for producing the SiC semiconductor component with the decreasing charge profile.

By manufacturing an SiC semiconductor component with the features described, the concentration of the electric field, when a high reverse voltage is applied to the pn junction, is eliminated as the electric field is flattened out along the extended edge termination. A low electric field in the lateral direction is achieved. Hence, the risk of a voltage breakdown at the edge of the main junction before a breakdown somewhere inside the bulk of the main junction is reduced. By forming the edges of a pn junction of SiC material with a structure similar to a Junction Termination Extension (JTE) of known silicon devices according to the present invention, the reverse voltage over the junction may be considerably increased 3 times or more before a breakdown occurs. Thus the present invention makes it possible to produce an SiC pn junction with a JTE withstanding a reverse voltage of 4.5 kV or more.

Furthermore, the present invention improves the reliability and long term stability. This is due to the reduction of the electric field in the SiC material at the periphery of the junction. The maximum surface electric field must be reduced by at least one order of magnitude if passivation schemes known from Si technology are used. Taking the measures relieves the stress inflicted on the passivation and isolation of the junction.

The SiC semiconductor component is manufactured according to the present invention by one of the alternative methods described below. The methods have in common that the junction has decreasing total charge and/or effective sheet charge density towards the outer edge.

One way to produce a JTE with the desired properties would be to use ion implantation of the surface surrounding the edge of the main pn junction area in discrete steps by means of lithography and masking techniques, where zones surrounding each other and surrounding the defined main pn junction area, are doped by means of ion implantation to have decreasing total charge and/or effective sheet charge density in the direction of the edge of the JTE formed, as shown (in FIG. 1). If this is done in discrete steps, each zone fully implanted to its wanted charge content, problems would arise with the alignment of the masks. Although a JTE would be produced, misalignment of the masks between the steps of the procedure would cause a distribution of the electric field having peaks as shown in the example shown in FIG. 2. FIG. 2 illustrates where the electric field peaks of a 2 $\mu$m overlap of zones each having 100 $\mu$m width for a JTE of a planar SiC pn junction produced according to the method of the present invention. Similar field peaks will appear when gaps are produced between the zones being unimplanted due to mask misalignment.

A low lateral electric field at an interface of a JTE surface to a passivation layer is vital to the proper function of the JTE. Unnecessary electric field peaks may be detrimental to the short- and long-term stability of the present component. Hence, one purpose of the invention is to establish a component with a pn junction of SiC where electric field peaks between implanted zones of a JTE are reduced to a minimum.

A first primary method for producing a component according to the present invention starts with a planar silicon carbide wafer including a doped layer of a first conducting type. On the plane surface of the wafer, a doped layer of a second conducting type is formed, for example by ion implantation. These two layers constitute the defined working area of a pn junction, referred to herein as the main junction. A formation of a number of doped zones by ion implantation of the second conducting type at the surface of the wafer in the region of the first conducting type and surrounding the main junction is carried out. At first, the entire device area of the component including the prospective implanted zones is implanted to a determined. After this step, the prospective outermost JTE zone is masked. The remaining unmasked area of the device is then ion implanted. The second JTE zone from the edge accordingly receives its proper dose. The masking and implantation process is then continued in a desired number of steps until finally the region constituting the pn junction layer of the second conducting type is implanted to a final dose. According to this method, the main pn junction and the JTE zones receive their respective doses by utilizing a procedure where the final dose of the respective zone is achieved by doses added during the consecutive steps of implantation. As a result, each JTE zone will have a decreasing total charge and/or effective sheet charge density towards the edge of the junction in a proportion required to obtain a desired effect on the surface field. Of course it is also possible to have the main junction masked during all of the implantation steps for forming the JTE. This may be preferred.

The method of the present invention can also be performed in a reversed way, according to a secondary method. The area exposed to consecutive implantations is increased step-wise by extending the opening of the implantation mask by removing the inner regions of the mask, and successively covering areas corresponding to prospective JTE zones, such that the innermost zone is exposed for every new implantation step, while the outermost zone is only implanted once. The total charge implanted will also decrease towards the edge of the termination according to this example.

Due to the costs involved and the complexity of the process, if many process steps are used, the methods disclosed so far for forming a JTE give rise to a limited number of discrete zones having different charge content and/or effective sheet charge density. Without the diffusion of dopants, the disclosed methods will still suffer from nonhomogeneities in the charge distribution, and as a consequence, peaks in the electric field distribution occur. Nevertheless, the methods of the present invention provide a way of forming JTEs of a pn junction for SiC.

However, achieving further reduction of the height of the peaks requires an increase in the number of discrete zones. The effect of the number of zones on the field reduction and field uniformity saturates, however, with an increasing number of zones. The primary and secondary methods provide an example of a self-aligning method as the linearization of the mask between the implantation steps, where the final total charge and/or effective sheet charge density of each JTE zone is built step by step, is not crucial according to methods. Linearization would be critical if the JTE zones were implanted one by one in a single-step implantation procedure per JTE zone.

A third or tertiary aspect of the invention provides a method for establishing zones with a quasi-homogeneous decreasing total charge and/or effective sheet charge density towards the edge. This is achieved by a single-step or a multi-step ion implantation of the device. According to the method where the region of the prospective JTE is covered with a mask where discrete zones with decreasing total charge are formed by open holes, lines or curves of the mask in a pattern defining the areas of the JTE to be implanted in a proper way. This may then be achieved by having greater areas of the openings or with openings much more dense in the innermost portion of the JTE compared to the condition at the edge of the JTE. Between these two limits the mask pattern is such that the areas exposed during the implantation evenly decrease. A smooth change in the effective doping and resulting volume and surface fields is thus achieved. The electric field peaks at the boundaries of the small implanted zones now have low values.

The advantages of an SiC component according to the invention include a realization of a reliable JTE capable withstanding a blocking voltage of more than 4.5 kV, and the component being characterized by a low surface field and a high immunity against surface charge.

The JTE as described herein is capable of handling surface charge of both polarities up to a charge density of $2 \cdot 10^{12}$ cm$^{-2}$. Even higher positive surface charge densities for an n-type surface layer can be tolerated but will require a redesigning of the charge densities in the JTE zones. Basically, the doping levels of the JTE zones will have to be increased. This causes an increase of the characteristic sheet charge density $Q_0$. Q. is the effective sheet charge density of the highest doped JTE zone. The charge density $Q_0$ has to be selected depending on the voltage for which the junction is designed.

BRIEF DESCRIPTION OF THE DRAWINGS

FIG. 5a represents a cross sectional view of an embodiment of the relationship between total charge content of the respective zone of the JTE shown in FIG. 1, while

FIG. 6b illustrates the electric field concentration laterally over a JTE produced with a device shown in FIG. 6a.

DETAILED DESCRIPTION OF THE INVENTION

The invention will be described in a number of embodiments with reference to the drawings.

Figure 1:
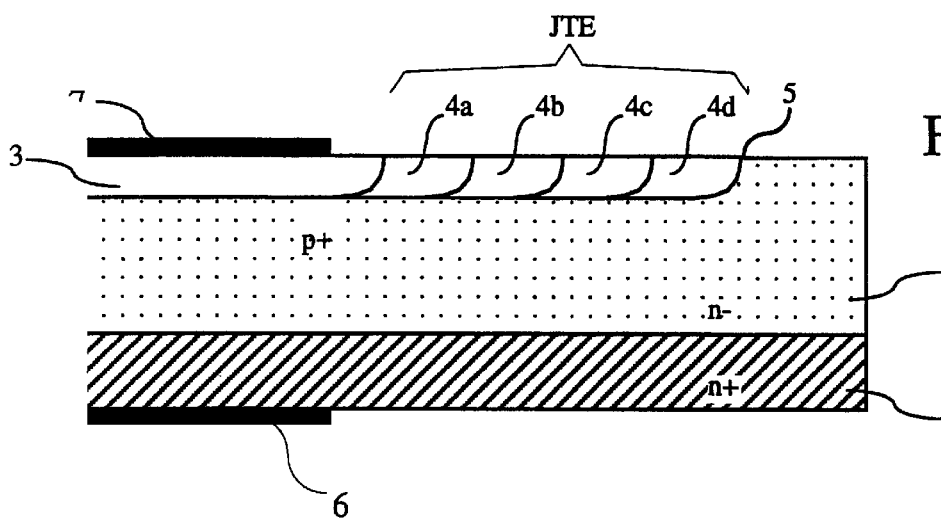
FIG. 1 represents a cross-sectional view of an embodiment of a pn junction of a planar semiconductor device according to the present invention on a wafer of SiC material including four zones having decreasing charge content and surround a p-doped anode to form a Junction Termination Extension, JTE, of the junction.
Figure 2:
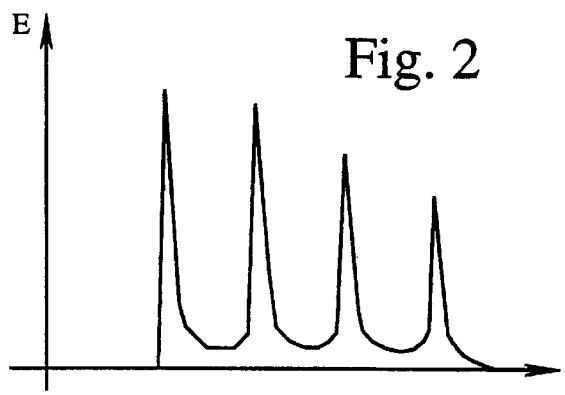
FIG. 2 illustrates the electric field concentration laterally over the the four-zone JTE shown in FIG. 1 produced without use of a self-aligning masking procedure.
Figure 3:
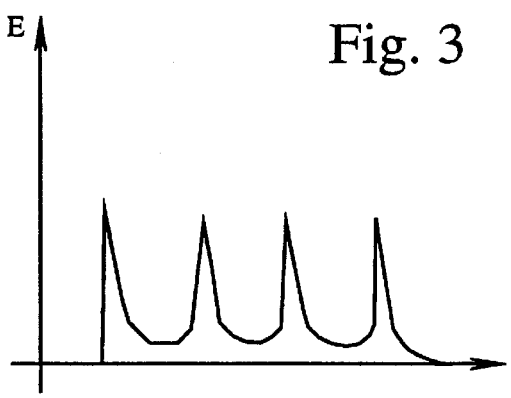
FIG. 3 shows the same electric field shown in FIG. 2, with the exception that one of the self-aligning primary or secondary methods of the present invention has been used to establish a four zone JTE.

FIG. 1 illustrates an example of an SiC semiconductor device having a JTE according to the present invention. The semiconductor is exemplified by a diode manufactured in SiC. The component shown in FIG. 1 is formed on a substrate of SiC consisting of a highly doped (n$^+$), n-conducting, layer 1 forming a cathode of the diode. On top of this n$^+$-layer 1, a first lower doped (n$^-$), n-conducting, layer 2 is established. These two n-conducting layers 1, 2 compose a wafer of a first conducting type of SiC semiconducting material.

At the top of the lower doped n-conducting layer 2 an anode formed by a second, highly doped, (p$^+$) p-conducting layer 3 is arranged facing the surface of the wafer, thus establishing a planar surface of the wafer. Contacts 6 and 7 contact the cathode and anode, respectively, of the diode. The first layer (n-conducting) and the second layer (p-conducting) compose a pn-junction. The interface between the first, n-conducting, layer 2 and the second, p-conducting, layer 3 define the working area of the pn-junction, referred to herein as the main junction, which as far as yet described does not comprise a junction termination extension, JTE. FIG. 1 shows a pn junction with a four-zone JTE forming an extension of the main junction in the lateral direction. Each zone 4a–4d surrounds the second conducting layer 3 and is of the same conducting type as the second conducting layer 3. The outermost zone 4d at its end outwards from the junction thus forms the outermost edge 5 of the JTE. The charge content and/or the effective sheet charge density of the respective zone 4a–4d decreases stepwise in the direction towards the JTE edge 5.

The semiconducting pn junction as shown in FIG. 1 is, for example, processed on a substrate of SiC consisting of a highly doped (n$^+$) n-conducting layer 1 and on top of the layer 1 a lower doped first, n-conducting, layer 2. These two n-conducting layers 1, 2 compose a planar wafer of the first conducting type, according to the example n-conducting, on which one or more pn junctions according to the invention can be built. In a second stage a p-conducting highly doped second layer 3 is formed on the wafer by an ion implantation technique, where for example Aluminium, Boron or Gallium could be used as implants. At the next stage, the extension of layer 3 is defined by means of masking and ion implantation.

Figure 4A:
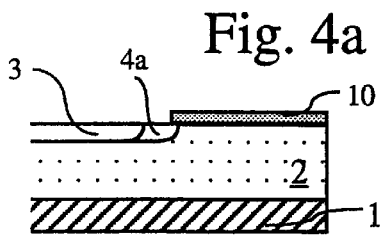
FIGS. 4a–4d represent cross sectional views of an embodiment of the masking and implantation steps for forming a JTE according to the aspect of the invention, utilizing the secondary method.
Figure 4B:
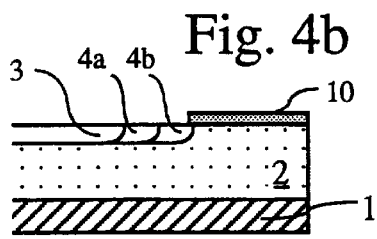
Figure 4C:
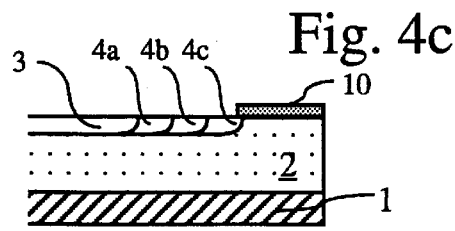
Figure 4D:
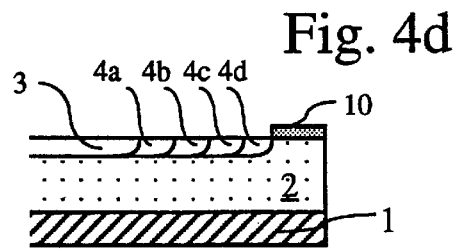
Figure 5A:
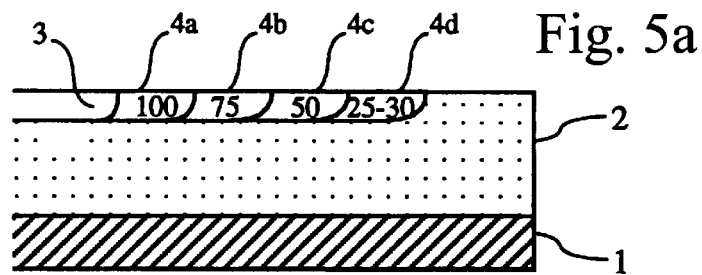
Figure 5B:
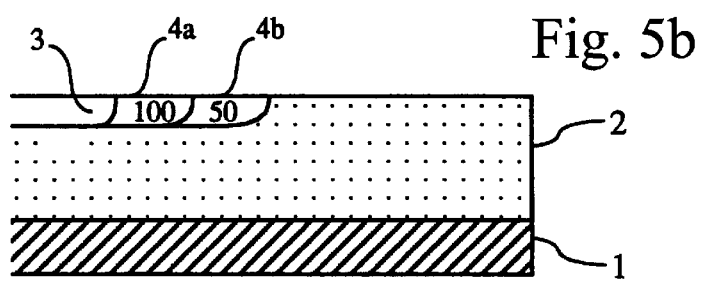
FIG. 5b and FIG. 5c show the same relationship for a two-zone JTE and a one-zone JTE, respectively.
Figure 5C:
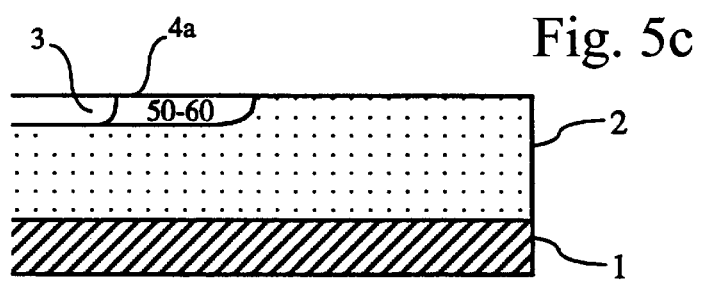

FIG. 4d shows the first step of forming the JTE. In the first step the entire area of the junction including the prospective JTE is implanted by a type of the desired ions up to a dose needed to establish the charge content and/or the effective sheet charge density of the outermost zone, in this example, the charge of zone 4d. The surface of the wafer outside the termination edge 5 is masked during this implantation step by a mask 10.

At the next stage, the mask 10 is extended to also cover the outermost zone 4d of the JTE. Then, an implantation of the exposed area comprising the anode uncovered JTE zones is carried out with the dose desired for the next to the outermost JTE zone, in this case zone 4c, to result in the charge content and/or the effective sheet charge density of the zone. This step is being shown in FIG. 4c. The implantation procedure is repeated in this way until all JTE zones 4a–4d have been implanted. FIGS. 4a–4d illustrate the steps of the procedure.

The JTE shown in FIG. 1 may be processed in another way, where the self-aligned implantation of the zones establishing the JTE is accomplished by a reverse procedure to the one described above. In this case, a mask 10 covers the area outside the anode, which may be implanted as a first step. As the second step, the mask is removed from the area, where the first JTE zone 4a is to be established. Then an implantation of the desired implant is once again carried out. In this way, the area of the surface of the device is increased in steps and exposed to implantation such that zones 4a–4d in the lateral direction outwards from the anode are formed having stepwise decreasing charge densities. The mask 10 may be etched away step by step. Alternatively, the mask may be removed and the device remasked for each process step. The process is illustrated by FIGS. 4a to 4d in succession.

In both methods described above, the anode 3 may preferably be masked and not implanted during the processing of the JTE zones.

In a preferred embodiment the effective sheet charge density of each JTE zone 4a–4d is expressed by the relation

Q1:Q2:Q3:Q4=100:75:50:25–30 where $Q_1$ denotes the effective sheet charge density of the innermost zone of the JTE, $Q_2$ the next to the innermost zone 4b and so on. The value 100 denotes the charge density in the zone with the highest doping in the JTE with a four zone embodiment. The value 100 also corresponds to a doping such that the zone with this charge density is completely depleted at full design voltage. This charge density is called the characteristic charge density $Q_0$ and is expressed in Coulombs/cm$^2$.

For a two zone JTE the relation is expressed as Q1:Q2=100:50. On the other hand, the effective sheet charge density of a one zone JTE is 50–60% of the characteristic sheet charge density $Q_0$.

These listed values for the sheet charge densities of the different zones of the JTE are preferred values. Generally for a four zone JTE the charge densities may be varied according to the intervals of the relation Q1:Q2:Q3:Q4=100:(60–85):(40–60):(15–40) With other alternative number of zones: three zones: Q1:Q2:Q3=100:(50–85):(25–60) two zones: Q1:Q2=100:(40–60) one zone: Q1=(40–70)

Figure 6A:
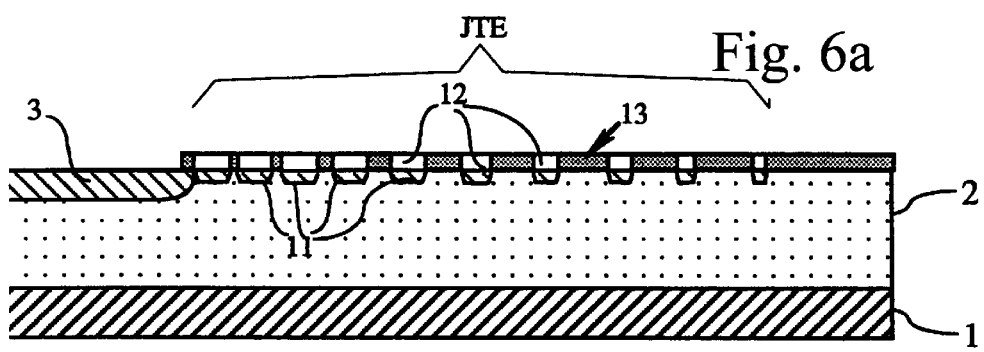
FIG. 6a represents a radial cross sectional view of an embodiment of a JTE formed utilizing a masking and implantation procedure according to the tertiary method, where the mask is designed to give rise to a decrease in the fraction of the area of the implanted zones per JTE unit area of the junction counted in the direction radially towards the edge of the termination.

FIG. 6a illustrates another embodiment of a semiconductor having a JTE according to the present invention. FIG. 6a illustrates a radial cross section through a pn junction of an SiC semiconductor showing a profile of the JTE of the junction. The structure of the pn junction is of the same type as discussed above in relation to FIG. 1. In this case, however, the JTE has a different structure. On top of the lower doped n-conducting layer 2 an anode formed by a second, highly doped, (p$^+$) p-conducting layer 3 is arranged facing the surface of the wafer, thus establishing a planar surface of the wafer. The first n-conducting layer 2 and the second, p-conducting, layer 3 compose a pn-junction. The interface between the first, n-conducting, layer 2 and the second, p-conducting, layer 3 define the working area of the pn-junction.

Figure 6B:
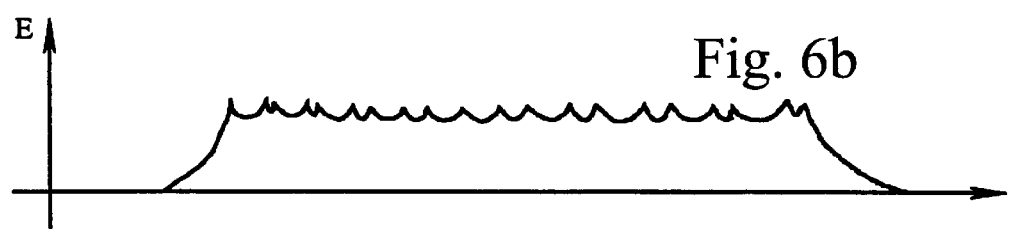

Surrounding the pn junction is a JTE comprising a number of spots 11 being of the same conducting type as layer 3 of the pn junction. The effective surface charge density in charge per cm$^2$ given by these spots 11 decreases in an outward direction from the pn junction to the edge 5 of the JTE. This may be achieved in different ways. For example, areas of the spots may be smaller towards the edge. Alternatively, the distance between the spots may be greater towards the edge 5, the distance between the spots may be greater towards the edge 5, or the charge content of the spots can be varied. Additionally, a combination of these different measures applied. All of these measures may be carried out with the aim of approximating an effective surface charge profile resulting in a desired flat electric field distribution along the extended termination. FIG. 6b shows an example of the electric field distribution in the lateral direction over the JTE profile.

The processing of the JTE of the embodiment shown in FIG. 6a is accomplished in a way similar to the primary and secondary methods described above. As an example, the semiconductor is processed on a substrate of SiC consisting of a highly doped (n$^+$), n-conducting, layer 1 and on top of the layer 1 a lower doped first, n-conducting, layer 2. These two n-conducting layers 1, 2 compose a planar wafer of the first conducting type, according to the example n-conducting, on which one or more pn junctions according to the invention can be built. In a second stage, a p-conducting highly doped second layer 3 is formed on the wafer by means of ion implantation technique, where for example Aluminium, Boron or Gallium could be used as implants. At the next stage a mask 13 with a design defining the areas and positions of the spots 11 by means of holes 12 is arranged on the wafer such that the mask 13 covers the areas of the prospective JTE between the spots. The wafer is then implanted by a type of the suggested ions up to a dose sufficient to establish the desired charge content of the spots exposed to the radiation. The surface of the wafer outside the termination edge 5 is masked during this implantation step. Preferably the implantation is carried out in one step, but several steps of implantation are, of course, also possible. An annealing step following the implantation of the zones will create an even better distribution of the charges between the implanted spots. For example using Boron as an implant, to utilize the benefit of a small occuring diffusion is a way to further improve the process.

A relatively smoothly varying surface charge profile can be obtained by this method, where a charge profile with the flat distribution of the electric field at the surface, as shown in FIG. 6b.

The implantation performed to achieve the object of the invention during the different steps is such that damage to the SiC crystal structure is avoided.

We claim:

1. A method of manufacturing a semiconductor component, said method comprising the steps of:

forming a lower doped layer of the first conducting type in a silicon carbide wafer at the surface of the wafer;

forming a higher doped anode layer of the second conducting type at the surface of and in said silicon carbide wafer, said lower doped layer and said anode forming a planar pn junction;

masking an area of the wafer adjacent a prospective first zone not to be implanted; and implanting an implant in the exposed area of the wafer, thus forming a first junction termination extension zone of the second conducting type surrounding the anode, wherein the implantation dose is such that the effective sheet charge density in the first zone is at most equal to the characteristic sheet charge density $Q_0$, corresponding to a doping such that the zone is completely depleted at full design voltage.

2. The method according to claim 1, further comprising the step of:

demasking an area adjacent the first zone; and implanting the demasked area with said implant to form a second junction termination extension zone, wherein the total implantation dose is such that the effective sheet charge density in the first zone is at most equal to the characteristic sheet charge density $Q_0$, corresponding to a doping such that the zone is completely depleted at full design voltage.

3. The method according to claim 1 further comprising the steps of:

demasking step-by-step consecutive areas adjacent the first zone; and implanting the demasked area after each demasking step for forming consecutive junction termination extension zones with a diminishing total sheet charge density, wherein the total implantation dose is such that the effective sheet charge density in the first zone is at most equal to the characteristic sheet charge density $Q_0$, corresponding to a doping such that the zone is completely depleted at full design voltage.

4. The method according to claim 3, wherein an implant used to form p-conducting type zones is selected from the group consisting of Aluminum, Boron, or Gallium, and an implant used to form n-conducting type zones is Nitrogen.

5. A method of manufacturing a semiconductor component, said method comprising the steps of:

forming a lower doped layer of the first conducting type in a silicon carbide wafer at the surface of the wafer;

forming a higher doped anode layer of the second conducting type at the surface of and in said silicon carbide wafer, said lower doped layer and said anode forming a planar pn junction;

masking an area of the wafer outside said anode with a mask patterned with holes; and implanting areas of the wafer exposed by the holes in the mask with an implant, wherein the implantation dose is such that the effective sheet charge density in an innermost zone is at most equal to the characteristic sheet charge density $Q_0$, corresponding to a doping such that the zone is completely depleted at full design voltage, thus forming spots of the second conducting type at the surface of the wafer, said spots constituting a junction termination extension having diminishing charge content in a radial direction away from the anode.

6. The method according to claim 5, wherein the holes in the mask decrease in area in a radial direction outward from the anode.

7. The method according to claim 5, wherein a distance between the holes in the mask increases in a radial direction outward from the anode.

8. The method according to claim 5, wherein a dose of the implant is reduced toward an edge of the termination.

9. A method of manufacturing a semiconductor component, said method comprising the steps of:

providing a silicon carbide wafer including a highly doped layer of a first conducting type, a lower doped layer of the first conducting type on top of the highly doped layer of the first conducting type, and a highly doped layer of a second conducting type forming an anode layer on top of the lower doped layer, said lower doped layer and said anode layer forming a planar pn junction;

forming at least one junction termination zone by masking at least a portion of the wafer and implanting an implant in exposed areas of the wafer not covered by the mask, wherein the implantation dose is such that the effective sheet charge density in an innermost zone is at most equal to the characteristic sheet charge density $Q_0$, corresponding to a doping such that the zone is completely depleted at full design voltage.

* * * * *